United States Patent [19]

Andris et al.

[11] Patent Number: 5,540,779
[45] Date of Patent: Jul. 30, 1996

[54] APPARATUS FOR MANUFACTURE OF MULTI-LAYER CERAMIC INTERCONNECT STRUCTURES

[75] Inventors: Gerald S. Andris, Poughkeepsie; John P. Gauci, Putnam Valley, both of N.Y.

[73] Assignee: International Business Machines Corporation, Armonk, N.Y.

[21] Appl. No.: 396,987

[22] Filed: Mar. 1, 1995

Related U.S. Application Data

[62] Division of Ser. No. 865,604, Apr. 9, 1992, abandoned.

[51] Int. Cl.$^6$ ........................................................ B05C 5/02
[52] U.S. Cl. .......................... 118/692; 118/323; 118/406; 156/64; 156/277; 427/96; 427/282
[58] Field of Search .............................. 427/96, 97, 272, 427/277, 282; 156/89, 277, 64; 101/114, 123, 124; 118/692, 406, 323; 425/135, 149, 90, 96, 811; 264/40.5, 272.17

[56] References Cited

U.S. PATENT DOCUMENTS

| | | |
|---|---|---|
| 3,384,931 | 5/1968 | Cochran et al. . |
| 4,245,273 | 1/1981 | Feinberg et al. . |
| 4,622,239 | 11/1986 | Schoenthaler et al. . |
| 4,661,368 | 4/1987 | Rohde et al. . |
| 4,720,402 | 1/1988 | Wojcik . |
| 4,808,435 | 2/1989 | Cropp et al. . |

FOREIGN PATENT DOCUMENTS

| | | |
|---|---|---|
| 0285850 | 10/1988 | European Pat. Off. . |
| 2300289 | 7/1974 | Germany . |
| 57-132393 | 8/1982 | Japan . |

OTHER PUBLICATIONS

Patent abstracts of Japan; vol. 9, No. 91 (C–277) 19 Apr. 1985 and JP–A–59 222 256 (Sony KK) *abstract*.

*Primary Examiner*—Jay H. Woo
*Assistant Examiner*—Joseph Leyson
*Attorney, Agent, or Firm*—Whitham, Curtis, Whitham & McGinn; Ira David Blecker

[57] ABSTRACT

In the manufacture of multi-layer ceramic interconnect structures, a greensheet is perforated with small holes and positioned on the support fixture of a screening machine. Then a planar surface of a screening mask is positioned in relation to the greensheet for producing the circuit pattern. Then the discharge end of a paste nozzle is positioned in relation to the opposite planer surface of the mask for injecting pressurized conductive paste through the nozzle into the mask. A normal force is applied to the nozzle toward the mask to maintain the discharge end of the nozzle with a clearance of 1 to 2 mils from the mask as the nozzle traverses the mask, injecting the conductive paste to extrude the circuit pattern on the greensheet and fill the perforations to produce vias to provide electrical connections between the layers produced. The force is adjusted dependent upon the pressure of the paste being injected into the mask to maintain the 1 to 2 mil clearance. Multiple layers of patterned greensheets are stacked and sintered under pressure and high temperature to produce the multi-layer ceramic interconnect structure.

3 Claims, 3 Drawing Sheets

5,540,779

APPARATUS FOR MANUFACTURE OF MULTI-LAYER CERAMIC INTERCONNECT STRUCTURES

This application is a divisional of application Ser. No. 07/865,604, filed on Apr. 9, 1992, now abandoned.

BACKGROUND OF THE INVENTION

1. Field of the Invention

The present invention generally relates to the manufacture of electrical circuits and more particularly to the manufacture of multi-layer ceramic interconnect structures.

2. General Description of Background

In the manufacture of multi-layer ceramic (MLC) interconnect structures conductive paste is injected through a nozzle into a screening mask. The mask extrudes a thick film conductive pattern onto a greensheet to form a circuit. The paste flows through holes in the surface of the mask to fill lines and other electrical structures in the mask and flows into perforations in the greensheet to provide electrical connections between layers of the MLC structure. At the same time, air flows out of the volume of the mask to make room for the paste. Some of the paste also flows back out onto the surface of the mask. This application is concerned with the interface between the nozzle and the mask as the paste flows from the nozzle.

Manufacture of multi-layer ceramic (MLC) interconnection structures is described in U.S. Pat. No. 4,245,273, to Feinberg et al., for PACKAGE FOR MOUNTING AND INTERCONNECTING A PLURALITY OF LARGE SCALE INTEGRATED SEMICONDUCTOR DEVICES, assigned to the assignee to the present invention, and hereby incorporated by reference. In these structures, a potentially differing interconnection pattern is formed on each of a multiplicity of layers of ceramic substrate. These intricate interconnection patterns include vias formed by perforating greensheet substrates and selectively filling the perforations with conductive paste to provide electrical continuity between the ceramic substrate layers of the MLC structure.

The respective greensheet substrates are then stacked and sintered under pressure and high temperature to form a unitary ceramic structure with many embedded interconnection lamina to provide electronic interconnection structures of high connection complexity. However, testing of each layer as it is formed requires a number of steps at least corresponding to the number of layers and an equal number of geometrical setups to allow testing by automated machinery. For this reason, it is common to optically inspect each layer as it is formed and to test only a portion of each layer for circuit continuity to some degree of confidence. Full electrical continuity is only tested a single time after the entire multi-layer ceramic (MLC) structure is assembled and sintered. This final test would be required even if the individual layers were fully tested individually, since the electrical connection patterns can be damaged by either the assembly or the sintering steps of the process.

Therefore, to achieve reasonably high manufacturing yields it is particularly necessary to form the individual layers by techniques which result in an extremely low incidence of defects. The conductive patterns must also be formed with high regularity and consistency to reduce susceptibility to the formation of defects during assembly and sintering.

The formation of the conductive patterns and filling of perforations to form vias in the individual substrate layers is done by assembling a stencil known as a mask on a greensheet substrate. The mask contains a plurality of channels for extruding the pattern onto the greensheet and filling the via perforations. Conductive paste is injected into the mask from the discharge end of a nozzle which is elongate across the width of the mask with the approximate same length as the width of the mask.

The mask directs the paste from the elongate nozzle to fill the via perforations and extrude the conductive paste circuit onto the greensheet as the nozzle is moved laterally to traverse the length of the mask. The nozzle may be traversed back and forth along the length of the mask in multiple passes as required. Then the nozzle and mask are separated from the greensheet leaving the conductive pattern on the greensheet. This process is commonly known as screening. Once a patterned greensheet layer is initially formed, other processing steps, such as drying, may also be employed to stabilize the pattern for assembly. Then the layers are assembled and, typically, sintered, as indicated above.

The use of a mask and the fineness of typical interconnection patterns and vias requires high paste pressure to be developed in the nozzle for the application of the conductive paste. At one time, the layer of conductive paste was typically applied by means of a Teflon™ squeegee. As conductive patterns increased in complexity, however, a squeegee was not able to develop sufficient pressures to reliably penetrate the masks with the conductive paste to form the desired interconnection patterns and to reliably fill the via perforations in the greensheets. Accordingly, it is presently deemed desirable to apply the conductive paste with a nozzle which confines the conductive paste against the mask and greensheet and allows full penetration of the mask and greensheet perforations. A description of a screen printing method for forming MLC structures using a nozzle is described in U.S. Pat. No. 4,808,435, to Cropp et al., assigned to the Assignee of the present invention and which is hereby incorporated by reference.

The cost of mask and nozzle maintenance including down time and replacement costs are critical to the economy of screening. The useful life of the masks and nozzles are measured by the number of passes the nozzle makes across the mask before the mask must be replaced. These measurements of mask and nozzle life are known in the art as pass factors.

High forces are applied by a mechanical spring, piston or other force transducer unit to the nozzle in the direction perpendicular to the plane of the mask (normal to the mask) in order to overcome the high pressure of injection of the paste and in order to confine the paste to maintain the paste pressure by insuring contact between the nozzle and the mask. Typically the normal force applied to the nozzle is preset at a fixed level to hold the nozzle against the mask for the highest expected working pressures. This results in relatively high nozzle forces against the mask. The force of the nozzle against the mask results in sliding friction forces as the nozzle traverses the mask during extrusion.

The normal and friction forces applied by the nozzle to the mask result in high stresses in the screening mask especially in the tabs which bridge between sections of the mask and across conductive lines in the pattern in order to hold the mask together. These stresses subject the mask to distortion and potential damage and contribute to broken tabs, dents and scoring of the mask. All these failure modes are fatal to the operation of the screening mask and the quality of the vias and circuit pattern produced. Also particles on the mask tend to wedge between the discharge end of the nozzle and the mask which dents and scores the mask and/or nozzle and places high loads on the tabs.

The masks are typically 2 to 3 mils thick and tabs are typically only about one mil thick and only slightly wider to avoid leaving opens in the mask separations across which they bridge. Efforts by those skilled in the art to prevent mask tabs from breaking have centered around increasing the physical size of the individual tabs and reducing the distance between tabs.

There has been some reduction in tab failures but the rate of premature mask failure due to tab breaking and other damage has not been acceptable.

The sliding friction results in wear of the mask, which is typically formed of a Molybdenum, Nickel or a Ni—Cu—Ni sandwiched sheet. The friction also causes wear of the nozzle and, for that reason, great effort has been expended to provide a nozzle surface which is resistant to abrasion. A nozzle formed of Tungsten Carbide is disclosed in SCREENING NOZZLE WITH NON-LINE CONTACT by R. C. Brilla et al. in IBM Technical Bulletin, Vol. 25, No. 6, November 1982, which is also incorporated by reference. An improved nozzle utilizing replaceable carbide rods for the nozzle surface is disclosed in co-pending application Ser. No. 07/631,540 CARBIDE ROD SCREENING NOZZLES by Andris et al. filed Dec. 21, 1990, incorporated herein by reference.

Where the mask has coarse features relative to the width of the contact surface between the nozzle and the mask, paste leaks around the contact surfaces of the nozzle at these features. This potential problem can be solved in the manner disclosed in U.S. Pat. No. 3,384,931, to Cochran et al., assigned to the assignee of the present invention and also incorporated by reference, by using a more complex stencil structure. That patent discloses a mask with features formed only on the side facing the greensheet, and with many tiny apertures in the opposite side facing the nozzle to allow penetration of the paste from the nozzle to the features and escape of air from the features. In that method, line contact between the elongate nozzle and the mask is preferred. Line contact allows a narrow pressure angle to be formed by essentially tangent contact between the nozzle and the mask in order to increase effective screening pressure. The viscosity of the conductive paste prevents high flow rates through the via perforations and through the pattern in the mask in order to maintain the pressure of the paste in the nozzle as the mask features are filled. The low viscosity of air allows the air to escape through the vias and mask features/pattern as the nozzle is dragged across the mask.

The more complex mask structure, however, makes it especially desirable that wear and scoring of the mask be minimized. To a certain degree, mask degradation is reduced by the line contact of the nozzle. However, as the nozzle itself becomes worn or otherwise degraded due to both friction with the mask and interaction with the conductive paste, the nozzle profile becomes more flat and the contact area becomes wide, increasing the tendency for scoring of the mask to occur.

The short useful life of the masks as well as the complexity thereof significantly increases the cost of the screening process and degrades the quality of the screened pattern. In addition, the substrate or carrier can become contaminated by metal shavings resulting from the scoring. Scoring also degrades the screening process since it degrades the tightness with which the nozzle fits against the mask, causing smearing of the paste as well as potential loss of pressure.

SUMMARY OF THE INVENTION

It is therefore an object of the present invention to improve throughput by reducing the need for nozzle rework to maintain nozzle profile.

It is another object of the invention to improve pattern quality and consistency of pattern quality in coating and/or extrusion processes, including reliable filling of via perforations in greensheets.

It is another object of the invention to reduce the risk of contamination of the greensheet with materials from the nozzle or mask.

It is a further object of the invention to increase pass factors and useful mask life.

It is yet another object of the invention to reduce premature scrapping of masks due to broken tabs and other mask damage due to wedging of particles and friction between the nozzle and the mask.

To achieve the above and other objects of the invention, applicants have developed a process for manufacturing multi-layer ceramic interconnect structures in which the nozzle is separated from the mask during extrusion of the conductive pattern on the greensheet and filling of via perforations in the greensheet while sufficiently confining the paste for maintaining the high pressures required by the process.

In accordance with another aspect of the invention a screening machine was developed in which the force applied to the nozzle in the direction perpendicular to the mask is dependent upon the setting of the pressure for the paste in the nozzle in order to maintain a clearance between the nozzle and the mask while maintaining the required paste pressures.

In accordance with a further aspect of the invention, a process for maintaining a clearance between a screening nozzle and a screening mask is provided, comprising the steps of applying a force to the screening nozzle in a direction perpendicular to a confronting surface of said screening mask, applying a pressure to a paste introduced through the nozzle into the mask and levitating a discharge end of the nozzle in relation to the surface of the screening mask by regulating said force applied to said screening nozzle relative to said pressure applied to said paste.

In accordance with another further aspect of the invention, a process for extruding a pattern of paste onto a substrate is provided, including the step of maintaining a clearance between a screening nozzle and a confronting surface of a screening mask, said clearance being sufficiently small to substantially contain a pressurized paste flowing through the nozzle and into the screening mask at the nozzle location for completely filling an intricate pattern in the mask for extruding said pattern onto the substrate and for filling perforations through the substrate to form vias.

In accordance with yet another aspect of the invention, a process is provided for controlling the clearance between a nozzle and a screening mask during extrusion of a pattern of paste onto a substrate, including the step of maintaining a predetermined relationship between a pressure applied to paste within said nozzle during extrusion of said pattern of paste onto said substrate and a force applied to said nozzle in a direction toward and approximately normal to said substrate such that, at an equilibrium, a predetermined clearance is maintained between said nozzle and a confronting surface of a screening mask overlaying said substrate.

In accordance with yet another aspect of the invention, a screening machine for depositing a thick film of paste in a pattern on a substrate for production of multi-layer ceramic interconnect structures, comprising a screen fixture with a surface for supporting the substrate in a predetermined position, a mask to provide a pattern for extruding paste onto a surface of the substrate, a mask frame for positioning the mask in relation to the substrate against the surface of the substrate, a paste nozzle for injecting paste into the mask for extruding the pattern of paste on the surface of the substrate, traverse means for moving the nozzle across the mask to inject paste into the entire mask, and adjustment means for maintaining a small clearance between the paste nozzle and the mask.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
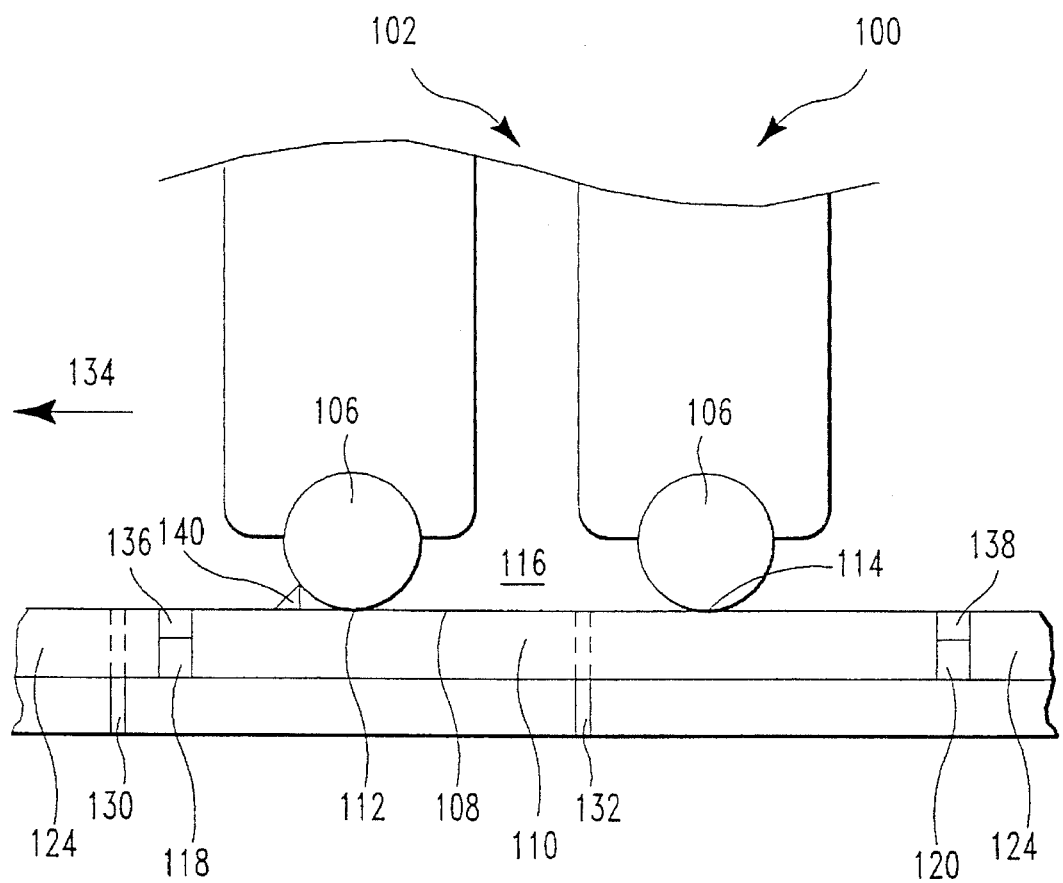
FIG. 1 is a schematic diagram illustrating the proprietary screening process used without the invention of applicants.

Referring now to the drawings, and more particularly to FIG. 1, there is shown schematically a proprietary screening process used without the invention of applicants. A high force is applied to nozzle 100 in a direction perpendicular to surface 108 of mask section 110 (i.e. normal to the mask), as indicated by arrow 102, to assure contact between rods 104, 106 of the nozzle and a confronting surface 108 of mask section 110 at contact lines 112, 114 respectively in order to contain pressurized conductive paste 116 in nozzle 100.

The pressure applied to the paste in the nozzle must be sufficient to completely fill gaps 118, 120 between mask section 110 and sections 124, 126 respectfully for extruding the desired pattern of paste on underlying planar substrate 128. The pressure must also be sufficient to fill perforations 130, 132 through substrate 128 to form conductive vias in the substrate.

The normal force applied to the nozzle is sufficient to overcome the force applied against the bottom of the nozzle between the contact points 112, 114 by the high pressure paste 116. The rods 104, 106 apply relatively high loads (not shown) perpendicularly against mask surface 108 at contact lines 112, 114 which results in high sliding frictional forces on the surface 108 of mask section 110 as the nozzle is made to relatively move along a path across the mask by appropriate drive means, indicated by arrow 134, to traverse the mask. The height of mask surface 108 may vary relative to the path 134 of the nozzle which causes variation in the normal force between the nozzle and mask surface and in the sliding frictional forces. These high forces result in wear and scoring of the mask and nozzle, can distort the mask, and can cause fatigue failures of the mask especially at the tabs 136, 138 between mask section 110 and mask sections 124, 126 respectively. Pattern quality suffers and early scrapping of the mask may result.

Occasionally, small particles such as particle 140, typically about one mil in size, tend to become wedged, as shown between the nozzle rods 104 and mask surface 108, which results in the application of extreme forces to the mask in the plane of mask section 110. These forces tend to fatigue and break tabs 136, 138 resulting in scrapping of the mask. Small particles wedged between the nozzle and mask may dent the mask and score the mask potentially causing a loss of paste pressure in the nozzle.

Figure 2:
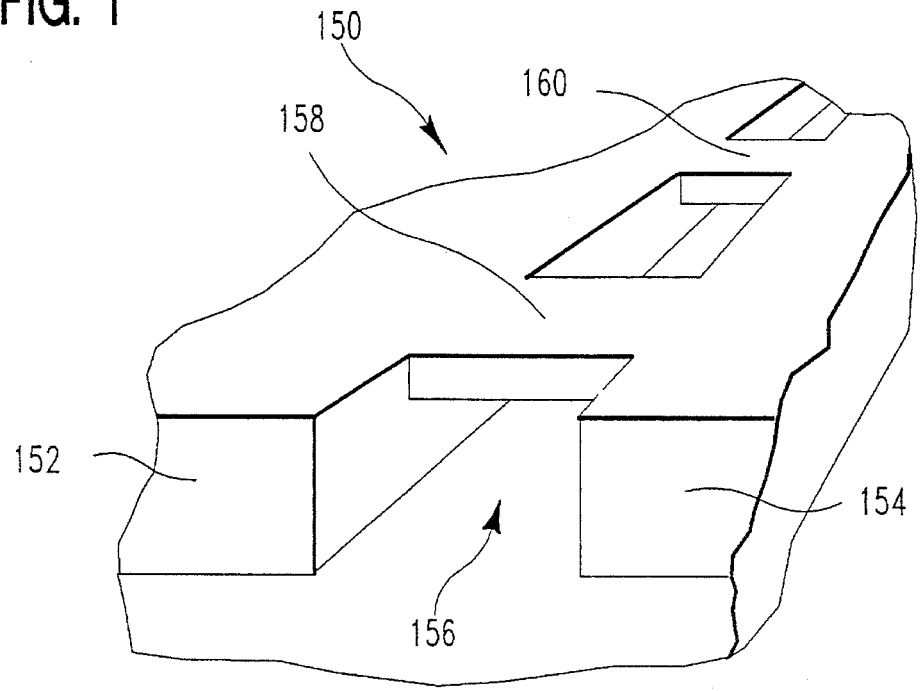
FIG. 2 is a schematic perspective sectional view of a elongate opening in the mask for extruding a conductive trace line on the mask and showing the tabs bridging the opening to connect the mask sections.

FIG. 2 illustrates a partial sectional view of a mask 150 showing two sections of a mask 152, 154 separated by an elongate opening 156 for producing a conductive trace line on a greensheet (not shown). Opening 156 is bridged by tabs 158, 160. The precise shapes of the side walls of the elongate opening and the tabs depends upon the materials and process used. The mask is typically 2 to 3 mils thick, and the tabs are typically 1 mil thick and only a few mils wide in order for paste to flow under the tabs so that the tabs do not result in opens in the conductive trace.

Figure 3:
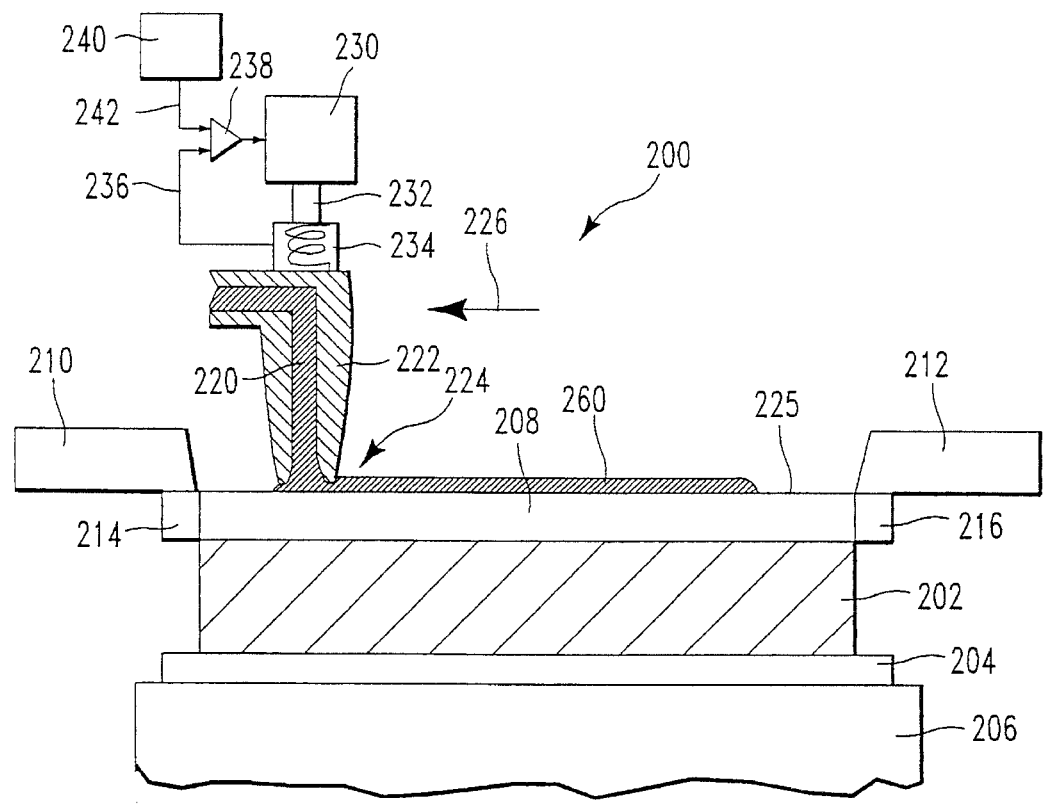
FIG. 3 is a schematic diagram illustrating the process of the invention with the nozzle separated from the mask and means for applying a variable force dependent upon the paste pressure in the nozzle.

FIG. 3 illustrates screening machine 200 of the invention significant parts of which are schematically shown. Greensheet 202 is positioned on a mylar support layer 204 on a screen fixture 206 which is vertically movable to bring the greensheet into contact with mask 208 as shown. Mask 208 is a stationary stencil fixed to mask frame 210, 212 at mask surfaces 214, 216, preferably by bonding.

Pressurized conductive paste 220 flows down through nozzle 222 to the discharge end 224 of nozzle 222 into the volume between the nozzle and a confronting surface 225 of mask 208, and into the mask to extrude a conductive pattern (not shown) on greensheet 202 and to fill perforations (not shown) in greensheet 202 to form conductive vias through the greensheet. Motor 230 which is a servo control, stepper motor moves a shaft 232 against a spring load cell 234 to apply a force to nozzle 222. An output signal from load cell 234 is conducted via 236 to comparator 238. The force applied to the nozzle is set by adjusting control 240, which outputs a reference signal by means of connection 242. For example, by turning a dial (not shown) on control 240 to adjust a reference voltage on connection 242 which is thus applied to comparator 238. The force is set depending upon the pressure of the paste so that the force applied to the nozzle compensates for the force applied by the pressure of the paste between the mask and the nozzle when the clearance between the mask and nozzle is approximately 1 to 2 mils. That is, the force applied to the nozzle in the direction of the mask is set to be in equilibrium with the forces exerted on the nozzle by the paste pressure when the clearance between the mask and nozzle is in the range of approximately 1 to 2 mils. Therefore, the pressure of the paste is sufficient to levitate nozzle discharge end 224 above mask surface 225 with a clearance of 1 to 2 mils as nozzle 222 floats across the length of mask 208 in the direction shown by arrow 226. For example, if the clearance were to slightly increase beyond this range, paste pressure would be reduced and the force applied to the nozzle through the arrangement of motor 230, shaft 232 and load cell 234 would be sufficient to reduce the clearance until an equilibrium of forces was again reached within the desired clearance range and the paste pressure restored. Conversely, if the clearance were to slightly decrease, the paste pressure would increase and cause the nozzle to be raised until the desired clearance and equilibrium of forces was again reached.

Figure 4:
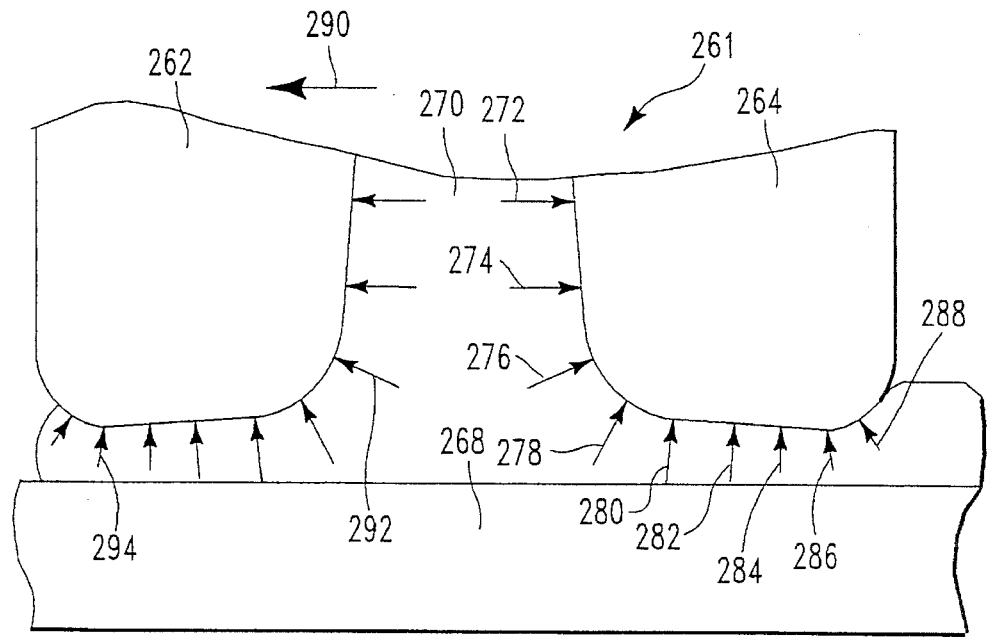
FIG. 4 is a schematic enlargement of the interface between the lips of the levitated nozzle and the mask schematically showing the forces applied to the bottom of the nozzle by the paste.

In FIG. 4 the mechanism for maintaining stable levitation of nozzle 261 is illustrated in relation to a magnified view of the interface between nozzle lips 262, 264 of the invention and mask 268. The pressure of the paste flowing into nozzle 261 between lips 262, 264 at location 270 is set depending upon the mask and properties of the paste to minimize rejections. The pressure of the paste exerts hydraulic force on the interior and bottom of the nozzle lips 262, 264 as indicated for nozzle lip 264 by arrows 272 through 288. As indicated by the decreasing size of the arrows, the pressure and resulting forces decrease along the bottom of the lips between arrows 276 and 288 due to fluid flow effects depending on paste viscosity and clearance.

During application, the nozzle moves back and forth along the length of the mask. When the nozzle is moving in the direction indicated by arrow 290 a squeegee effect will cause the forces 276 to 286 to be higher and the forces at 292 to 294 to be lower than they would be without movement. When the nozzle moves in the direction opposite arrow 290 forces 292 to 294 will be higher.

When the clearance between nozzle lips 262, 264 and mask 268 decreases, due for example to irregularities in the mask, the flow between the nozzle lips and mask decreases. As a result the paste pressure along the bottom of the lips increases toward the level at 270 so that more force is applied to the bottom of the lip. As described above in relation to FIG. 3, load cell 234 reacts to the increased force causing motor 230 to activate for lifting nozzle lips 262, 264 to increase the clearance until the preset relative force corresponding to the desired clearance is achieved. Conversely, if the clearance increases then paste pressure against the bottom of the lip is correspondingly reduced, force decreases and the motor will activate to lower the nozzle. Thus, at equilibrium force conditions a stable clearance is maintained by maintaining a constant level of force between the motor and the nozzle.

The motor control system and nozzle configuration should be selected based on fluid flow and control system principles so that the force is maintained at a relatively constant level as the nozzle traverses the mask in order to prevent contact between the nozzle and the mask and prevent loss of paste pressure in the nozzle. Also, the clearance between the nozzle and mask should be approximately constant so that high quality patterns are consistently produced. However, some variation can not be avoided, for example, variation in force is required to activate the load cell.

Thus, the force applied by the nozzle to the mask, as described above in reference to FIG. 1, is eliminated, and therefore, the sliding friction force developed as the nozzle traverses the mask is also eliminated. The forces applied to the mask are limited to the pressure of the paste, and viscous shear forces applied parallel to the mask surface by the paste due to traversing the nozzle across the length of the mask. Thus, fatigue is reduced and scoring due to sliding contact is eliminated. Also, the occasional small particles (not shown) on the mask do not become wedged between the end of the nozzle and the mask because they tend to be smaller than the clearance between the mask and nozzle. Scoring, denting and breaking of tabs of the mask caused by such particle wedging is reduced. Nozzle 222 is automatically adjusted to follow small variations in the topography of the mask surface 225 due to the interactive control provided by load cell 234 and comparator 238. Because wear, scoring, denting and fatigue are reduced, less expensive materials and/or simpler manufacturing techniques may be used to produce the nozzle and mask. Slightly more paste 260 may remain unused on the surface of the mask, but improvements in pattern quality, nozzle life (or rework interval) and mask life more than compensate for the additional cost of paste.

Figure 5:
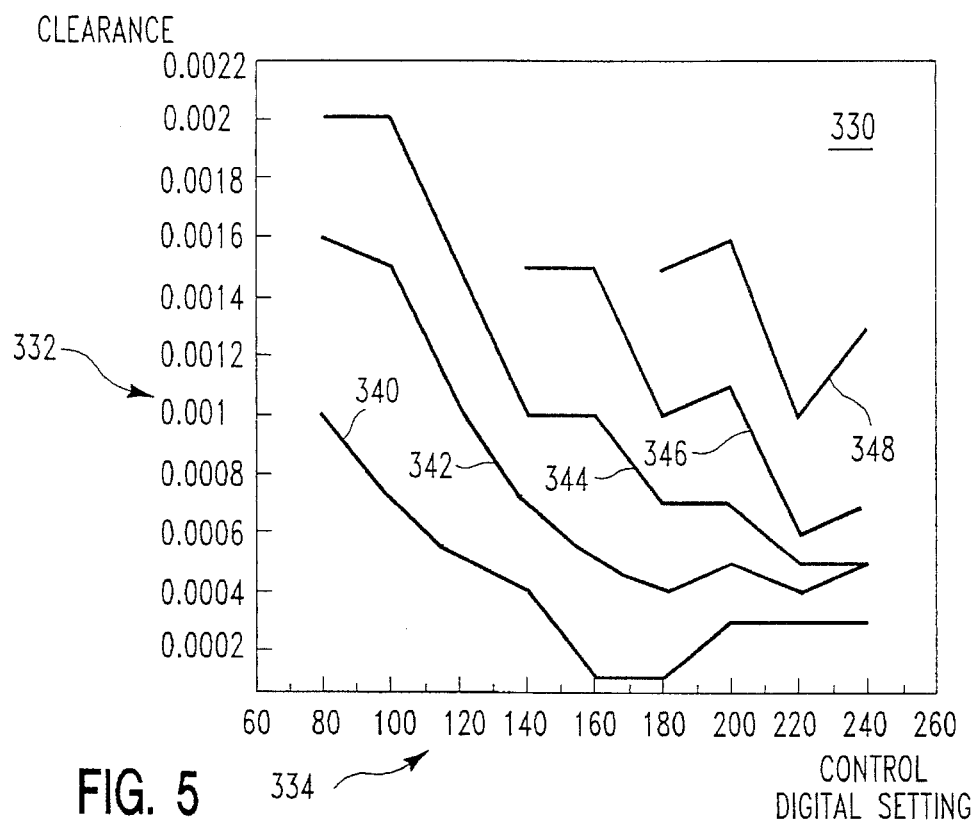
FIG. 5 is a graph indicating the relative normal force that must be applied to the nozzle to maintain a selected clearance in which each curve on the graph is dependent upon the paste pressure.

Graph 330 in FIG. 5 illustrates the relationship between clearance 332 and load control settings 334 which are established empirically for each combination of mask pattern, nozzle configuration, paste viscosity and control system. These curves were established for the various paste pressures by injecting paste into the nozzle and varying the relative load on the nozzle while mechanically measuring the resulting clearance between the nozzle and mask. Clearance 332 is in inches listed along the vertical axis and control dial settings 334 which are listed along the horizontal axis of the graph 330 corresponding to output voltage signals for the selected control system which control the relative force or load applied to the nozzle by the motor. Curves 340, 342, 344, 346, 348 are provided for paste pressures of 50, 55, 60, 65, and 70 psi respectively. Using these curves, the control dial setting for the system can be determined which will maintain the desired clearance between the discharge end of the nozzle and the mask, which is preferably from 1 to 2 mils above the mask. For example, if paste pressure is 55 psi then according to curve 342 in order to maintain a clearance of 1 mil, the dial on the controller should be set to approximately 120.

Figure 6:
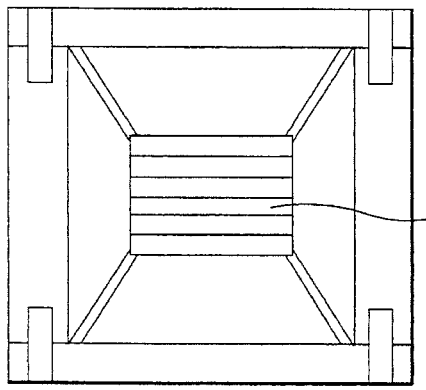
FIG. 6 illustrates the stacked greensheets within a container for applying pressure during the sintering process of the invention.
Figure 7:
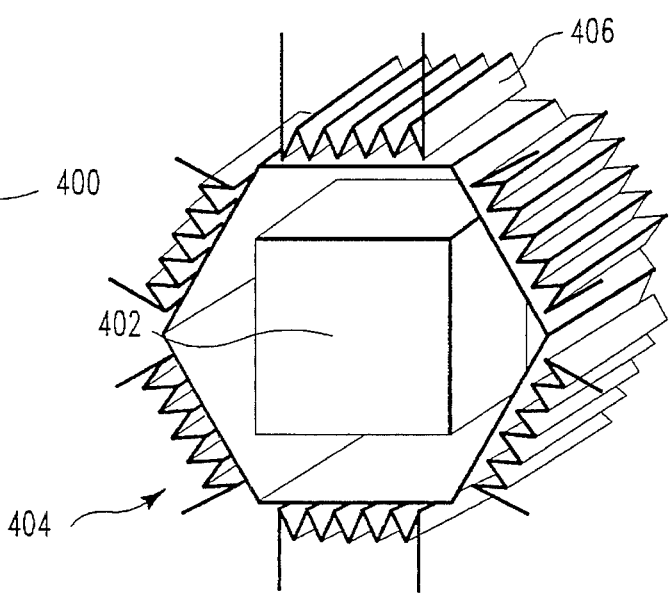
FIG. 7 illustrates the container of the greensheet stack moving through an oven section.

FIGS. 6 and 7 illustrate the layering steps of the process of the invention. After the greensheet patterns are produced, the greensheets are positioned on a tray (not shown) and passed through hot air for drying the paste. Then the greensheets are arranged in stack 400 of FIG. 4, containing one or more greensheet layers. The stack is arranged within container 402 and inserted into oven 404 as shown in FIG. 5. Electric elements 406 in FIG. 5, positioned about oven 404, heat the oven, and the stack is sintered under the heat and pressure to produce a multi-layer ceramic interconnect structure.

Alternately, single-layer ceramic substrates may be produced by sintering a single layer under pressure and heat. Single-layer substrates may be produced with a different conductive pattern on each side of the substrate and with the patterns interconnected as required by vias. Such single-layer ceramic substrates may be utilized, for example, in a manner similar to circuit boards.

After a patterned greensheet layer is produced, the circuit pattern is tested and if necessary repaired in order to provide the highest possible yield for finished ceramic structures. Green lights on automatic test equipment (not shown) which use optical and partial electrical testing of the circuit indicate that no defects are detected. Circuits that receive green lights are accepted. Circuits, which do not receive a green light, are accepted if they pass a visual microscopic inspection. Circuits which do not pass the visual inspection are usually repaired by filling opens and/or by cutting shorts. Full electrical continuity is only tested after the multi-layer ceramic structure is assembled and sintered. Yield depends on this final full continuity test.

A machine of the invention was built and the process of the invention tested. Several test production runs were made using similar masks and multi-pass screening for comparing the machine and process of the invention with the current machine and process.

A production run of 439 greensheets using the non-contact process of the invention was compared with a production run of 635 greensheets using a contact process. The following table documents differences between the processes in green lights for automatic inspection of signal layers and for inspection for partial fills of vias.

|  | GREEN LIGHTS | PARTIAL FILLS | YIELD |
|---|---|---|---|
| PERCENT CHANGE | 2.0% | 0.2% | −1.0% |

As shown above, the number of partial fills of vias increases slightly for the process of the invention, but the change is not significant. More importantly, the percentage of patterned greensheets accepted based on green lights for automated tests increases by 2.0% by using the non-contact process of this invention. That is, the percentage of screening operations indicated to be successful by automated testing increases while the portion of the cost attributable to mask and nozzle wear is greatly decreased.

Another production run of 519 greensheets using the non-contact process of the invention was compared with another production run of 600 greensheets using a contact process. The following table documents differences between processes in acceptance by green lights for automatic inspection, acceptance by visual microscopic inspection, repairs of opens and shorts and final yield after full continuity testing.

|  | GREEN LIGHTS | VISUAL INSPEC | TOTAL REPAIR | REPAIR OPENS | REPAIR SHORTS | YIELD |
|---|---|---|---|---|---|---|
| % CHANGE | 1.8% | −0.3% | −1.7% | −1.8% | 0.3% | −0.5% |

As shown above, the percentage of patterned greensheets accepted based on green lights for automated tests increases by 1.8% and the percent of opens which required repair is reduced by 1.8% by using the non-contact process of this invention. The results of this test are favorable because opens are difficult to repair compared to shorts and not all opens are visible.

In both test comparisons total yield decreases slightly, but the change was not significant compared to cost savings expected due to extending mask life. These tests demonstrate that the process of the invention for improving mask life does not have other serious negative impacts on the production of the ceramic interconnect structures.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A screening machine for depositing a thick film of paste in a pattern on a substrate for production of multi-layer ceramic interconnect structures, comprising:

a screen fixture with a surface for supporting the substrate in a predetermined position;

a mask to provide a pattern for extruding paste onto a surface of the substrate;

a mask frame for positioning the mask in relation to the substrate against the surface of the substrate;

a paste nozzle for injecting paste into the mask for extruding the pattern of paste on the surface of the substrate;

means for moving the nozzle across the mask to inject paste into the entire mask; and adjustment means for avoiding contact and maintaining a small clearance between the paste nozzle and the mask by levitating the nozzle above the mask by the pressure of the paste between the mask and the nozzle.

2. The machine of claim 1 in which the adjustment means includes force means for applying a preset load to the nozzle in a direction perpendicular to the mask, said load depending upon the pressure of the paste in the nozzle during levitation for maintaining the small clearance between the paste nozzle and the mask.

3. The machine of claim 2 in which the force means includes a servo-control motor for applying a force against the nozzle in a direction normal to the mask;

a spring load cell positioned between the motor and the nozzle for generating a load signal dependent on said normal force;

a controller for generating an adjustable reference signal, and a comparator for comparing the reference signal and the load signal and for generating an output signal dependent on such comparison for controlling the motor to maintain said force at an approximately constant level.

* * * * *